US008686487B2

(12) United States Patent
Sandhu et al.

(10) Patent No.: US 8,686,487 B2
(45) Date of Patent: Apr. 1, 2014

(54) SEMICONDUCTOR DEVICES AND ELECTRONIC SYSTEMS COMPRISING FLOATING GATE TRANSISTORS

(75) Inventors: Gurtej Sandhu, Boise, ID (US); Chandra Mouli, Boise, ID (US); Di Li, Highland, CA (US)

(73) Assignee: Micron Technology, Inc., Boise, ID (US)

( * ) Notice: Subject to any disclaimer, the term of this patent is extended or adjusted under 35 U.S.C. 154(b) by 1166 days.

(21) Appl. No.: 11/763,335

(22) Filed: Jun. 14, 2007

(65) Prior Publication Data
US 2008/0308858 A1 Dec. 18, 2008

(51) Int. Cl.
*H01L 29/788* (2006.01)
*H01L 21/336* (2006.01)

(52) U.S. Cl.
USPC ............ 257/316; 257/315; 438/257; 438/266

(58) Field of Classification Search
USPC .......... 257/315–317, 319–322, 324, E21.209, 257/E29.29, E29.3, E29.129; 438/201, 211, 438/257, 260, 266
See application file for complete search history.

(56) References Cited

U.S. PATENT DOCUMENTS

| | | | |
|---|---|---|---|
| 4,718,973 A | | 1/1988 | Abraham et al. |
| 5,886,379 A | * | 3/1999 | Jeong ............................ 257/319 |
| 5,953,610 A | | 9/1999 | Takeuchi |
| 6,153,904 A | | 11/2000 | Yang |
| 6,218,698 B1 | | 4/2001 | Hai |
| 6,256,225 B1 | | 7/2001 | Noble et al. |
| 6,297,097 B1 | | 10/2001 | Jeong |
| 6,323,085 B1 | | 11/2001 | Sandhu et al. |
| 6,461,915 B1 | | 10/2002 | Rudeck |
| 6,469,341 B1 | | 10/2002 | Sung et al. |
| 6,611,020 B2 | | 8/2003 | Hai |
| 6,614,072 B2 | | 9/2003 | Sandhu et al. |
| 6,621,130 B2 | * | 9/2003 | Kurokawa et al. ............ 257/390 |
| 6,680,508 B1 | | 1/2004 | Rudeck |
| 6,762,093 B2 | | 7/2004 | Rudeck |
| 6,849,501 B2 | | 2/2005 | Rudeck |
| 6,916,707 B2 | | 7/2005 | Rudeck |

(Continued)

OTHER PUBLICATIONS

Cooke, Jim. "Flash memory 101: An Introduction to NAND flash," CommsDesign, Mar. 20, 2006, www.commsdesign.com/showArticle.jhtml?articleID=183700957, printed Jan. 22, 2007.

(Continued)

*Primary Examiner* — Hung Vu
(74) *Attorney, Agent, or Firm* — TraskBritt

(57) ABSTRACT

Semiconductor devices include one or more transistors having a floating gate and a control gate. In at least one embodiment, the floating gate comprises an intermediate portion extending between two end portions. The intermediate portion has an average cross-sectional area less than one or both of the end portions. In some embodiments, the intermediate portion may comprise a single nanowire. In additional embodiments, semiconductor devices have one or more transistors having a control gate and a floating gate in which a surface of the control gate opposes a lateral side surface of a floating gate that defines a recess in the floating gate. Electronic systems include such semiconductor devices. Methods of forming semiconductor devices include, for example, forming a floating gate having an intermediate portion extending between two end portions, and configuring the intermediate portion to have an average cross-sectional area less than one or both of the end portions.

44 Claims, 14 Drawing Sheets

(56) References Cited

U.S. PATENT DOCUMENTS

| | | | |
|---|---|---|---|
| 6,921,696 B2 | 7/2005 | Rudeck | |
| 6,924,186 B2 | 8/2005 | Sandhu et al. | |
| 6,943,403 B2 * | 9/2005 | Park | 257/317 |
| 7,005,697 B2 | 2/2006 | Batra et al. | |
| 7,015,098 B2 | 3/2006 | Rudeck | |
| 7,015,539 B2 * | 3/2006 | Ozawa | 257/317 |
| 7,019,353 B2 | 3/2006 | Lindsay et al. | |
| 7,072,223 B2 | 7/2006 | Bhattacharyya | |
| 7,149,117 B2 | 12/2006 | Roohparvar | |
| 2002/0109163 A1 | 8/2002 | Forbes et al. | |
| 2003/0235064 A1 | 12/2003 | Batra et al. | |
| 2004/0028812 A1 | 2/2004 | Wessels et al. | |
| 2005/0023588 A1 | 2/2005 | Sandhu et al. | |
| 2005/0078518 A1 | 4/2005 | Nguyen | |
| 2005/0085040 A1 | 4/2005 | Forbes | |
| 2005/0090085 A1 | 4/2005 | Lindsay | |
| 2005/0106811 A1 | 5/2005 | Forbes | |
| 2005/0133851 A1 | 6/2005 | Forbes | |
| 2005/0133860 A1 | 6/2005 | Forbes | |
| 2005/0173755 A1 | 8/2005 | Forbes | |
| 2005/0215002 A1 | 9/2005 | Violette | |
| 2005/0259468 A1 | 11/2005 | Violette | |
| 2005/0265076 A1 | 12/2005 | Forbes | |
| 2005/0266678 A1 | 12/2005 | Helm et al. | |
| 2005/0269626 A1 | 12/2005 | Forbes | |
| 2005/0279983 A1 | 12/2005 | Helm et al. | |
| 2005/0281092 A1 | 12/2005 | Lindsay | |
| 2005/0285178 A1 | 12/2005 | Abbott et al. | |
| 2006/0003588 A1 | 1/2006 | Lindsay et al. | |
| 2006/0006456 A1 | 1/2006 | Abbott et al. | |
| 2006/0022254 A1 | 2/2006 | Roohparvar | |
| 2006/0024885 A1 | 2/2006 | Sandhu et al. | |
| 2006/0028870 A1 | 2/2006 | Roohparvar | |
| 2006/0030146 A1 | 2/2006 | Helm et al. | |
| 2006/0034119 A1 | 2/2006 | Nguyen | |
| 2006/0040447 A1 | 2/2006 | Violette et al. | |
| 2006/0046402 A1 | 3/2006 | Li et al. | |
| 2006/0081911 A1 | 4/2006 | Batra et al. | |
| 2006/0086314 A1 | 4/2006 | Zhang et al. | |
| 2006/0102949 A1 | 5/2006 | Roohparvar | |
| 2006/0203553 A1 | 9/2006 | Roohparvar | |
| 2006/0211201 A1 | 9/2006 | Sandhu et al. | |
| 2006/0221691 A1 | 10/2006 | Ha et al. | |
| 2006/0226471 A1 | 10/2006 | Lindsay et al. | |
| 2006/0237776 A1 | 10/2006 | Forbes et al. | |
| 2006/0258093 A1 | 11/2006 | Violette et al. | |
| 2006/0258095 A1 | 11/2006 | Sandhu et al. | |
| 2006/0258096 A1 | 11/2006 | Noble et al. | |
| 2006/0261404 A1 | 11/2006 | Forbes | |
| 2006/0262602 A1 | 11/2006 | Nazarian | |
| 2006/0267075 A1 | 11/2006 | Sandhu et al. | |
| 2006/0273370 A1 | 12/2006 | Forbes | |
| 2006/0273456 A1 | 12/2006 | Sant et al. | |
| 2006/0286747 A1 | 12/2006 | Mouli et al. | |
| 2007/0012988 A1 | 1/2007 | Bhattacharyya | |
| 2007/0029600 A1 | 2/2007 | Cohen | |
| 2007/0030737 A1 | 2/2007 | Aritome | |

OTHER PUBLICATIONS

NAND Flash 101: An Introduction to NAND Flash and How to Design it in to Your Next Product, Micron Technical Note, Micron Technology, Inc. 1-28 (2006).

Xia et al. "One-Dimensional Nanostructures: Synthesis, Characterization, and Applications," 15 Advanced Materials 353-389 (Mar. 2003).

International Search Report for PCT/US2008/065754 dated Aug. 25, 2008, 3 pages.

Written Opinion of the International Searching Authority for PCT/US2008/065754 dated Aug. 25, 2008, 4 pages.

* cited by examiner

SEMICONDUCTOR DEVICES AND ELECTRONIC SYSTEMS COMPRISING FLOATING GATE TRANSISTORS

FIELD OF THE INVENTION

Embodiments of the present invention relate to semiconductor devices having one or more floating gate transistors, to electronic systems including such semiconductor devices, and to methods of forming such semiconductor devices.

BACKGROUND OF THE INVENTION

Semiconductor devices include one or more integrated circuits that can be used to store data, process electronic signals, etc. Such semiconductor devices are used in virtually all modern electronic devices. There are several different types of semiconductor devices used in modem electronics including, for example, memory devices, electronic signal processors, devices for capturing or acquiring images, etc. Each of these semiconductor devices typically comprise a plurality of transistors, which can be used as gates or switches for electrical signals.

FIG. 1 is a schematic cross-sectional view of a conventional transistor 10 that may be used in a memory cell of a non-volatile memory device. The transistor 10 may be fabricated on or in a substrate 11, which may comprise a doped semiconductor material. The transistor 10 shown in FIG. 1 has a dual gate structure and includes a control gate 12, a floating gate 14, a source 16, and a drain 18. The source 16 and drain 18 may comprise, for example, doped regions in or on the substrate 1, which itself may be doped of opposite polarity relative to the source 16 and the drain 18. By way of example and not limitation, the source 16 and drain 18 may comprise n-doped regions in or on the substrate 11, and the substrate 11 may be p-doped at least in the region thereof between the source 16 and the drain 18 so as to provide an npn type structure in the substrate 11 below the floating gate 14. The floating gate 14 is electrically isolated from the control gate 12 by the so-called "inter-gate dielectric" material 20, and from the underlying substrate 11 (including the source 16 and the drain 18) by another dielectric material, which is often referred to as the "tunnel dielectric" material 22 or the "tunnel oxide." The floating gate 14 also may be further electrically isolated from surrounding structures by a passivation layer 24.

The control gate 12 and the floating gate 14 are capacitively coupled to one another (i.e., positioned such that an electrical capacitance may be generated therebetween), and the control gate 12 is used to selectively charge the floating gate 14. In other words, when a sufficient voltage is applied to the control gate 12, electrons may be caused to "tunnel" through the tunnel dielectric material 22 from the substrate 11 to the floating gate 14, where they may remain even after the voltage applied to the control gate 12 is interrupted, since the floating gate 14 is electrically isolated by the inter-gate dielectric material 20, the tunnel dielectric material 22, and the passivation layer 24.

When a given reading voltage is applied between the source 16 and the drain 18, the presence of electrons on the floating gate 14 may cause a relatively lower current to flow between the source 16 and the drain 18 (and the memory cell may be characterized as representing a "0"), while the absence of electrons on the floating gate 14 may allow a relatively higher current to flow between the source 16 and the drain 18 (and the memory cell may be characterized as representing a "0").

By utilizing a floating gate 14 that is electrically isolated by the inter-gate dielectric material 20, the tunnel dielectric material 22, and the passivation layer 24, any electrons present on the floating gate 14 may remain thereon even after power to the memory device is interrupted. As a result, memory devices having transistors that include such dual-gate structures are considered non-volatile.

Other types of semiconductor devices including, for example, electronic signal processors and devices for acquiring or capturing images (often referred to as "imagers"), also may include a plurality of transistors for storing data therein. In other words, such semiconductor devices may have subsystems of components that comprise memory. As a result, such semiconductor devices also may comprise transistors such as that described above.

As integrated circuit fabrication processes improve, the feature sizes of the various elements in the integrated circuits are reduced so as to enable the fabrication of smaller semiconductor devices and/or semiconductor devices having increased cell densities, and, hence, higher data storage capacities.

As previously mentioned, a capacitance is generated between the floating gate and the control gate in transistors having a dual gate structure. Such transistors are conventionally fabricated side-by-side in an array on a substrate. As a result, a capacitance also may be generated between the floating gates of adjacent transistors in the array. Such inter-transistor capacitances can negatively affect the operation of the semiconductor device.

The coupling ratio (CR) of a semiconductor device (e.g., a memory device) may be defined as the ratio of the capacitance $C_{FG-CG}$ between the floating gate and the control gate in each transistor to the capacitance $C_{FG-FG}$ between the floating gates of adjacent transistors (i.e., $CR=C_{FG-CG}/C_{FG-FG}$). It is typically desirable to maximize the coupling ratio (when the coupling ratio is defined in this manner) to enhance the reliability and performance of the semiconductor device. As the feature size of the various elements (e.g., the size of the various elements of the transistors, as well as the spacings therebetween) in the integrated circuits of such semiconductor devices are scaled downward, it may be more difficult to maintain a high coupling ratio due, at least in part, to the decreasing surface area between opposing surfaces of the control gate and the floating gate and the decreasing spacing or distance between the floating gates in adjacent transistors. The decreasing surface area between opposing surfaces of the control gate and the floating gate may cause a decrease in the capacitance $C_{FG-CG}$ between the floating gate and the control gate in each transistor, and the decreasing spacing or distance between the floating gates in adjacent transistors may cause an increase in the capacitance $C_{FG-FG}$ between the floating gates of adjacent transistors.

For the reasons stated above, and for other reasons which will become apparent to those skilled in the art upon reading and understanding the present specification, there is a need in the art for improved floating gate transistors, such as those that exhibit relatively high coupling ratios, and that can be scaled to smaller feature sizes without decreasing the coupling ratio to an unacceptable level.

DETAILED DESCRIPTION

As discussed in further detail below, in some embodiments the present invention includes semiconductor devices, such as, for example, memory devices, electronic signal processors (often referred to as "microprocessors"), and imagers having one or more floating gate transistors. These semiconductor devices include one or more transistors having a floating gate and a control gate. The floating gate comprises two end portions and an intermediate portion extending between the end portions. The intermediate portion may have an average cross-sectional area less than one or both of the end portions. In some embodiments, the intermediate portion may comprise a single nanowire. In additional embodiments, a surface of the control gate may oppose a lateral side surface of the floating gate that defines a recess in the floating gate. In additional embodiments, the present invention includes electronic systems that comprise such semiconductor devices. In yet additional embodiments, the present invention includes methods of forming such semiconductor devices.

As used herein, the term "nanowire" means any elongated structure having a length and an average width, the average width being less than about 50 nanometers.

As used herein, the term "III-V type semiconductor material" means any material predominantly comprised of one or more elements from group IIIB of the periodic table (B, Al, Ga, In, and Ti) and one or more elements from group VB of the periodic table (N, P, As, Sb, and Bi).

As used herein, the term "II-VI type semiconductor material" means any material predominantly comprised of one or more elements from group IIB of the periodic table (Zn, Cd, and Hg) and one or more elements from group VIB of the periodic table (O, S, Se, Te, and Po).

As used herein, the term "wafer" means any structure that includes a layer of semiconductor type material including, for example, silicon, germanium, gallium arsenide, indium phosphide, and other III-V or II-VI type semiconductor materials. Wafers include, for example, not only conventional wafers formed completely of a semiconductor material, but other substrates such as silicon-on-insulator (SOI) type substrates, silicon-on-sapphire (SOS) type substrates, and epitaxial layers of silicon supported by a layer of base material. Semiconductor type materials may be doped or undoped. Furthermore, when reference is made to a "wafer" in the following description, previous process steps may have been utilized to at least partially form elements or components of a device, such as a circuit, in or over a surface of the wafer.

The illustrations presented herein are not meant to be actual views of any particular semiconductor device, transistor, workpiece, or system, but are merely idealized representations which are employed to describe the present invention. Additionally, elements common between figures may retain the same numerical designation.

Figure 1:
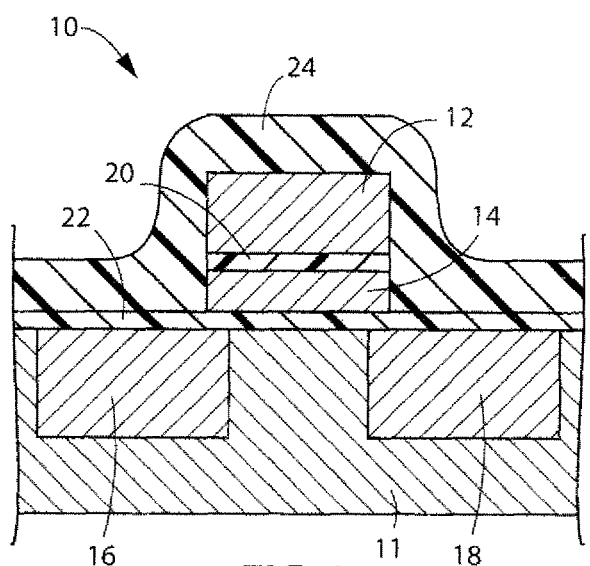
FIG. 1 is a partial cross-sectional view of a semiconductor device illustrating a transistor having a dual-gate structure known in the art.
Figure 2A:
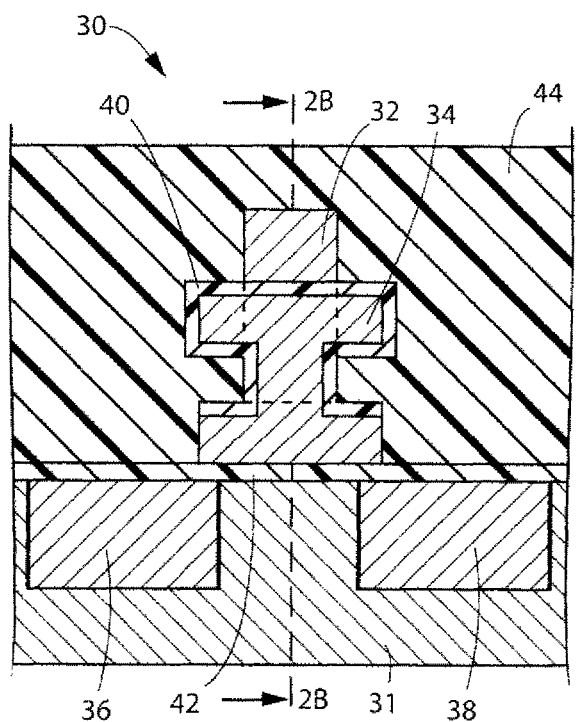
FIG. 2A is a partial cross-sectional view of an embodiment of a semiconductor device of the present invention.
Figure 2B:
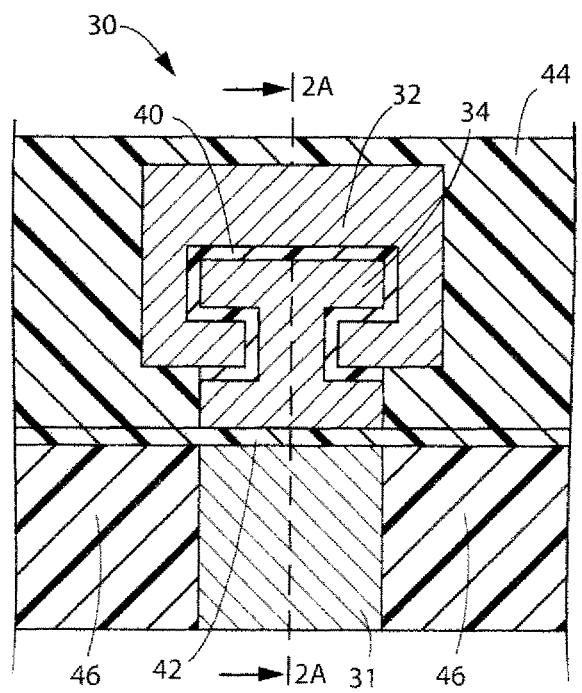
FIG. 2B is a partial cross-sectional view of the semiconductor device shown in FIG. 2A taken along section line 2B-2B therein.

FIGS. 2A and 2B are cross-sectional views of a portion of an embodiment of a semiconductor device 30 of the present invention taken substantially transverse to one another, and illustrate a transistor having a dual gate structure. In other words, FIG. 2B is a cross-sectional view of the semiconductor device 30 taken along section line 2B-2B shown in FIG. 2A, and FIG. 2A is a cross-sectional view of the semiconductor device 30 taken along section line 2A-2A shown in FIG. 2B.

As shown in FIG. 2A, the transistor may comprise a control gate 32, a floating gate 34, a source 36, and a drain 38. The transistor may comprise, for example, at least a portion of a memory cell in an array of memory cells of the semiconductor device 30. In some embodiments, the semiconductor device 30 may comprise a memory device (e.g., a Flash memory device) having an array of memory cells, each of which may comprise a transistor as shown in FIGS. 2A and 2B.

The transistor may be fabricated on or in a substrate 31, which may comprise a doped semiconductor material. The source 36 and the drain 38 may comprise, for example, doped regions in or on the substrate 31, and the substrate 31 itself may be doped of opposite polarity relative to the source 36 and the drain 38. By way of example and not limitation, the source 36 and drain 38 may comprise n-doped regions in or on the substrate 31, and the substrate 31 may be p-doped at least in the region thereof between the source 36 and the drain 38 so as to provide an npn type structure in the substrate 31 below the floating gate 34.

The floating gate 34 is electrically isolated from the control gate 32 by an inter-gate dielectric material 40, and from the underlying substrate 31 (including the source 36 and the drain 38) by another region (which may comprise a layer) of dielectric material, which is referred to herein as a "tunnel dielectric" material 42. The control gate 32 and the floating gate 34 also may be electrically isolated from surrounding structures by yet another region of dielectric material, which is referred to herein as a passivation layer 44 (although the passivation layer 44 may comprise what is often referred to as an interlayer dielectric). By way of example and not limitation, the inter-gate dielectric material 40 and the tunnel dielectric material 42 may comprise an oxide material (e.g., $SiO_2$), a nitride material (e.g., $Si_3N_4$), or a combination of oxide and nitride materials such as, for example, an oxynitride material, a re-oxidized oxynitride material, or a so-called "oxide-nitride-oxide" (ONO) structure.

The control gate 32 and the floating gate 34 are capacitively coupled to one another (i.e., sized, shaped, and positioned such that an electrical capacitance may be generated therebetween), and the control gate 32 may be used to selectively charge the floating gate 34. When a sufficient voltage is applied to the control gate 32, electrons may be caused to "tunnel" through the tunnel dielectric material 42 from the substrate 31 to the floating gate 34, where they may remain even after the voltage applied to the control gate 32 is interrupted, since the floating gate 34 is electrically isolated from surrounding conductive structures by the inter-gate dielectric material 40, the tunnel dielectric material 42, and the passivation layer 44.

As show in FIG. 2B, the source 36 and the drain 38 (which are not visible in FIG. 2B because the source 36 is positioned in front of the plane of FIG. 2B and the drain 38 is positioned behind the plane of FIG. 2B) may be laterally separated from surrounding structures (e.g., elements of adjacent transistors, conductive lines, etc.) by isolation regions 46 (e.g., shallow trench isolation (STI) regions), which may comprise a dielectric material such as, for example, an oxide (e.g., silica ($SiO_2$)).

As shown in FIGS. 2A and 2B, at least a portion of the floating gate 34 may have a dumbbell-shaped cross-section, and at least a portion of the control gate 32 may have a shape that is complementary to that of the floating gate 34. For example, at least a portion of the control gate 32 may have a shape that is complementary to that of at least about one-half (e.g., the upper half shown in FIGS. 2A and 2B) of the floating gate 34. The shape of the floating gate 34 and the complementary shape of the control gate 32 are described in further detail below with reference to FIGS. 3A and 3B.

Figure 3A:
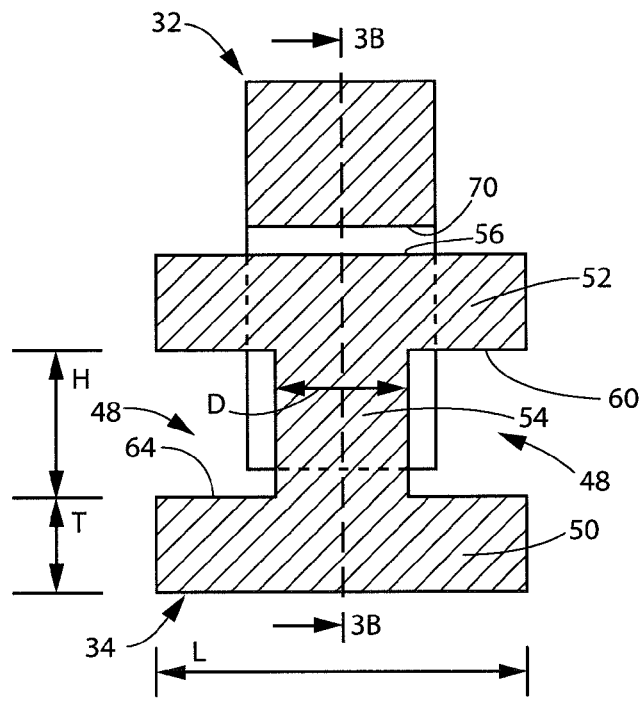
FIG. 3A is an enlarged view of a control gate and a floating gate of the semiconductor device shown in FIG. 2A.
Figure 3B:
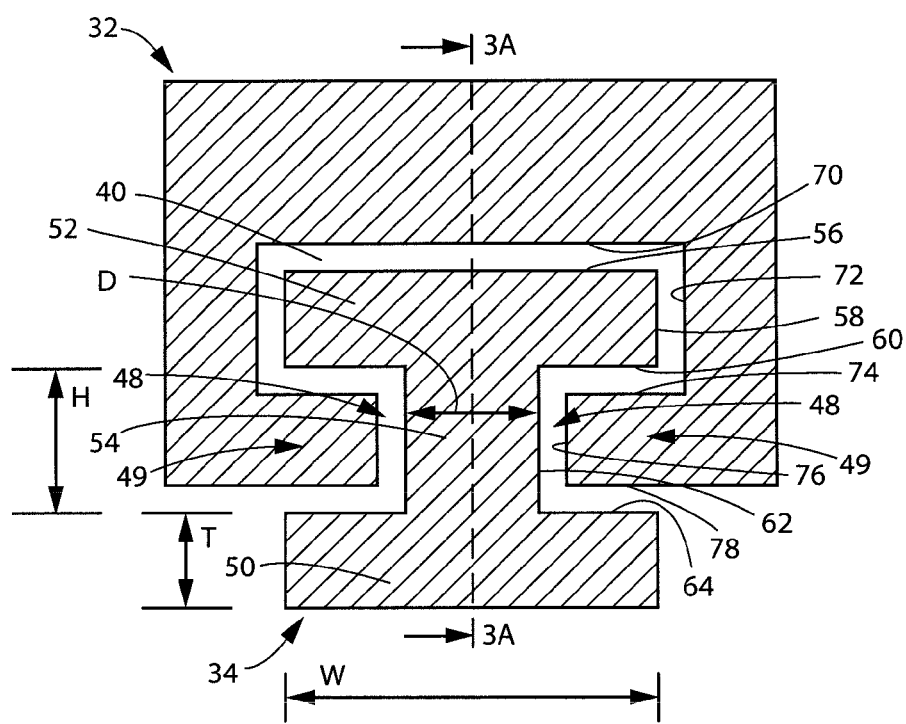
FIG. 3B is an enlarged view of the control gate and the floating gate as illustrated in FIG. 2B.

FIG. 3A is an enlarged view of the control gate 32 and the floating gate 34, as shown in FIG. 2A. Similarly, FIG. 3B is an enlarged view of the control gate 32 and the floating gate 34, as shown in FIG. 2B. FIG. 3B is a cross-sectional view of the structure shown in FIG. 3A taken along section line 3B-3B shown in FIG. 3A, and FIG. 3A is a cross-sectional view of the structure shown in FIG. 3B taken along section line 3A-3A shown in FIG. 3B. The other elements of the semiconductor device 30 are not illustrated in FIGS. 3A and 3B to simplify the figures and facilitate description of the control gate 32 and the floating gale 34.

Referring to FIG. 3A, the floating gate 34 may include a first end portion 50, a second end portion 52, and an intermediate portion 54 extending between the first end portion 50 and the second end portion 54. The first end portion 50 may be located proximate the source 36 and the drain 38 (FIG. 2A), and the second end portion 52 may be located proximate the control gate 32. The intermediate portion 54 may have an average transverse cross-sectional area (i.e., in a plane extending into the plane of FIG. 3A perpendicular to section line 3B-3B shown therein) that is less than that of each of the first end portion 50 and the second end portion 52. In other words, the end portions 50, 52 may be enlarged relative to the intermediate portion 54. In some embodiments, the first end portion 50, the second end portion 52, and the intermediate portion 54 of the floating gate 34 each may have either a substantially circular or a substantially rectangular transverse cross-sectional shape (i.e., in a plane extending into the plane of FIG. 3A perpendicular to section line 3B-3B shown therein). As a non-limiting example, the first end portion 50 and the second end portion 52 each may have a substantially rectangular (e.g., square) transverse cross-sectional shape, and the intermediate portion 54 may have a generally cylindrical shape and may have a generally circular transverse cross-sectional shape. By way of example and not limitation, the first end portion 50 and the second end portion 52 each may have a length L (FIG. 3A) and a width W (FIG. 3B) of less than about one-hundred nanometers (100 nm) (e.g., about seventy nanometers (70 nm) or about 35 nanometers (35 nm)), and a thickness T of less than about seventy nanometers (70 nm) (e.g., between about ten nanometers (10 nm) and about thirty nanometers (30 nm)). The intermediate portion 54 may have a height H of between about fifty nanometers (50 nm) and about three hundred nanometers (300 nm) (e.g., about one hundred nanometers (100 nm)), and an average diameter D of less than about seventy nanometers (70 nm) (e.g., about twenty nanometers (20 nm)).

In other embodiments of the present invention, the first end portion 50, the second end portion 52, and the intermediate portion 54 of the floating gate 34 may have any other size and shape in which at least a portion of the intermediate portion 54 has an average transverse cross-sectional area that is less tan that of each of the first end portion 50 and the second end portion 52. Furthermore, the first end portion 50 and the second end portion 52 need not be identical and may have differing sizes, differing shapes, or both differing sizes and shapes.

As previously mentioned, at least a portion of the control gate 32 may have a shape that is complementary to that of at least a portion of the floating gate 34. For example, the exterior surfaces of the floating gate 34 may define at least one recess 48 in the lateral sides of the floating gate 34 (FIG. 3A), and the exterior surfaces of the control gate 32 may define at least one protrusion 49 (FIG. 3B), which may be disposed at least partially within the at least one recess 48 of the floating gate 34, as discussed in further detail below.

Referring to FIG. 3B, the control gate 32 may have at least one surface 70 opposing an upper surface 56 of the second end portion 52 of the floating gate 34, and at least one surface 72 opposing a lateral side surface 58 of the second end portion 52 of the floating gate 34. In some embodiments, the control gate 32 also may have at least one surface 74 opposing at least a portion of a lower surface 60 of the second end portion 52 of the floating gate 34 within the recess 48, at least one surface 76 opposing at least a portion of a lateral side surface 62 of the intermediate portion 54 of the floating gate 34, and at least one surface 78 opposing at least a portion of an upper surface 64 of the first end portion 50 of the floating gate 34.

In some embodiments, the thickness of the inter-gate dielectric material 40 (FIGS. 2A and 2B) between the control gate 32 and the floating gate 34 may be substantially uniform. Furthermore, the average thickness of the inter-gate dielectric material 40 between the control gate 32 and the floating gate 34 may be less than about twenty nanometers (20 nm) (e.g., about twelve nanometers (12 nm)). In such configurations, the average distance separating opposing surfaces of the control gate 32 and the floating gate 34 may be substantially uniform. By way of example and not limitation, the average distance separating opposing surfaces of the control gate 32 and the floating gate 34 may be less than about twenty nanometers (20 nm) (e.g., about twelve nanometers (12 nm)).

As shown in FIG. 3A, in some embodiments, the control gate 32 may not entirely surround the floating gate 34, and the at least one protrusion 49 (FIG. 3B) of the control gate 32 may not substantially fill the recess 48 of the floating gate 34. In other embodiments, however, the control gate 32 may substantially entirely surround the floating gate 34, and the at least one protrusion 49 (FIG. 3B) of the control gate 32 may substantially fill the recess 48 of the floating gate 34 (other than the volume of the recess 48 occupied by the inter-gate dielectric material 40, as shown in FIGS. 2A and 2B)). In such embodiments, the cross-sectional view shown in FIG. 3A may appear substantially identical to the cross-sectional view shown in FIG. 3B.

The control gate 32 and the floating gate 34 (including the end portions 50, 52 and the intermediate portion 54) may comprise a conductive or semiconductor material such as, for example, polysilicon (doped or undoped), a doped or undoped semiconductor material (e.g., silicon, germanium, a III-V type semiconductor material, a II-VI type semiconductor material), a conductive metal (e.g., copper, aluminum, tungsten, platinum), or a conductive metal silicide (e.g., tungsten silicide, nickel silicide, cobalt silicide, titanium silicide).

In some embodiments, the intermediate portion 54 of the floating gate 34 may comprise a single nanowire having a first end in electrical contact with the first end portion 50 of the floating gate 34 and a second end in electrical contact with the second end portion 52 of the floating gate 34. By way of example and not limitation, such a nanowire may comprise a nanotube, such as a single wall carbon nanotube (SWCNT) or a multi-walled carbon nanotube (MWCNT). In additional embodiments, such a nanowire may comprise a substantially solid nanowire substantially comprised of a semiconductor material such as, for example, silicon, germanium, gallium, a III-V type semiconductor material, or a II-VI type semiconductor material. Furthermore, each nanowire may comprise a single crystal. In yet other embodiments, such a nanowire may comprise a substantially solid nanowire substantially comprised of a metal such as, for example, cobalt, copper, gold, nickel, platinum, or silver. Any type of nanowire may be used as long as the nanowire exhibits sufficient electrical conductivity and can be formed, grown, placed, or otherwise provided within the transistor during fabrication thereof as discussed in further detail below.

One embodiment of a method of the present invention that may be used to manufacture a semiconductor device comprising one or more transistors like that shown in FIGS. 2A and 2B is described below with reference to FIGS. 4-20.

Figure 4:
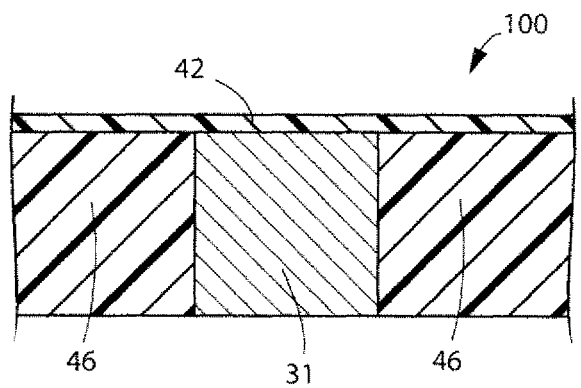
FIGS. 4 through 20 are partial cross-sectional side views of a workpiece and illustrate an embodiment of a method of the present invention that may be used to form a semiconductor device like that shown in FIGS. 2A and 2B.

Referring to FIG. 4, methods known in the art may be used to provide (e.g., form) a workpiece 100 that includes a substrate 31. The substrate 31 may comprise a full or partial semiconductor wafer, and may comprise a doped semiconductor material. Only a portion of the substrate 31 that is to comprise a single transistor is shown in the figures to facilitate illustration and description. It is contemplated, however, that the substrate 31 may be used to form one or more semiconductor devices (not shown), each of which may comprise a plurality of transistors like that shown in the figures. The workpiece 100 may comprise a plurality of isolation regions 46, as well as a source 36 and a drain 38 (FIG. 2A) for each transistor being formed on the workpiece 100 (although in some devices, such as NAND Flash memory devices, at least some transistors may be connected in series, the drain 38 of one transistor being continuous with the source 36 of an adjacent transistor). As also shown in FIG. 4, a layer of tunnel dielectric material 42 may be deposited at least over the regions of the workpiece 100 on which a control gate 32 and floating gate 34 (FIGS. 2A and 2B) are to be fabricated.

Figure 5:
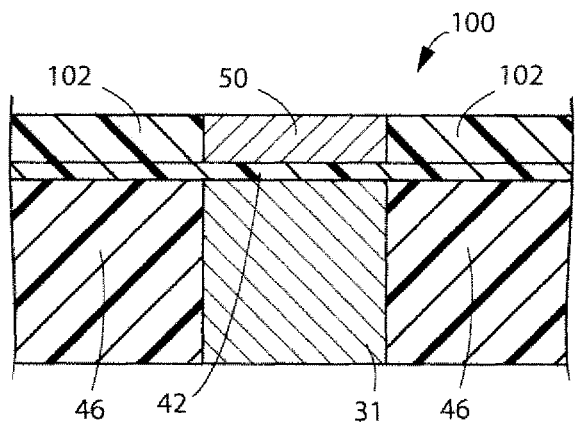

Referring to FIG. 5, a first end portion 50 of a floating gate 34 (FIGS. 3A and 3B) may be formed over the tunnel dielectric material 42 that is positioned generally vertically above and horizontally between a source 36 and a drain 38 (FIG. 2A). A dielectric material 102 may be provided around the first end portion 50 of the floating gate 34. The first end portion 50 and the surrounding dielectric material 102 may be formed using conventional lithographic or sublithographic processes (e.g., photolithography (with or without a so-called "pitch-doubling" process) or nanoimprint lithography). In some embodiments, for example, a layer of conductive material (not shown) may be deposited over the workpiece 100 and patterned using, for example, a masking and etching process to form the first end portion 50 of the floating gate 34. A layer of dielectric material 102 then may be deposited over the workpiece 100 and the first end portion 50. The layer of dielectric material 102 then may be planarized using, for example, a chemical-mechanical polishing (CMP) process to expose the first end portion 50 through the layer of dielectric material 102. In additional embodiments, the layer of dielectric material 102 may be deposited over the substrate 31 and patterned using, for example, a masking and etching process to form a recess (not shown) therein exposing the underlying tunnel dielectric material 42 at the location at which it is desired to form the first end portion 50. A layer of conductive material (not shown) then may be deposited over the layer of dielectric material 102 and within the recess, after which the layer of conductive material may be planarized using, for example, a chemical-mechanical polishing (CMP) process to expose the underlying layer of dielectric material 102 and to faun the first end portion 50 of the floating gate 34.

Figure 6:
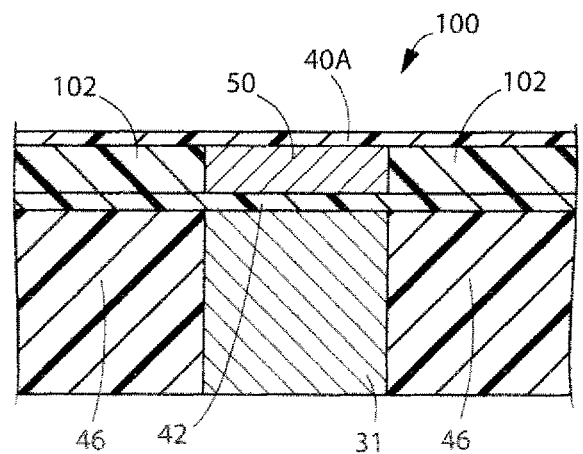

Referring to FIG. 6, a layer of inter-gate dielectric material 40A may be deposited, epitaxially grown, or otherwise formed at least over the regions of the workpiece 100 comprising the first end portion 50 of the floating gate 34. By way of example and not limitation, the inter-gate dielectric material 40A may comprise an oxynitride material and may be deposited using a chemical vapor deposition (CVD) process.

Figure 7:
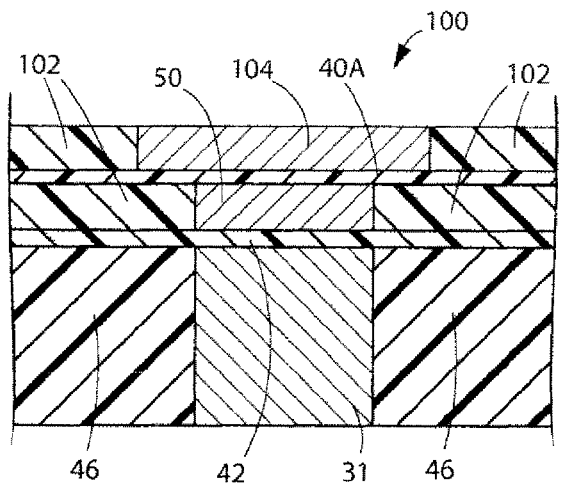

As show in FIG. 7, a conductive structure 104 may be formed over the inter-gate dielectric material 40A. The conductive structure 104 may be vertically aligned with the first end portion 50 of the floating gate 34. A portion of the conductive structure 104 will be used to form at least a portion of the control gate 32 that includes the previously described at least one protrusion 49 (FIG. 3B) thereof, as described in further detail below. The conductive structure 104 may be formed using conventional lithographic or sublithographic methods as previously described in relation to the first end portion 50 of the floating gate 34 and FIG. 5.

Figure 8:
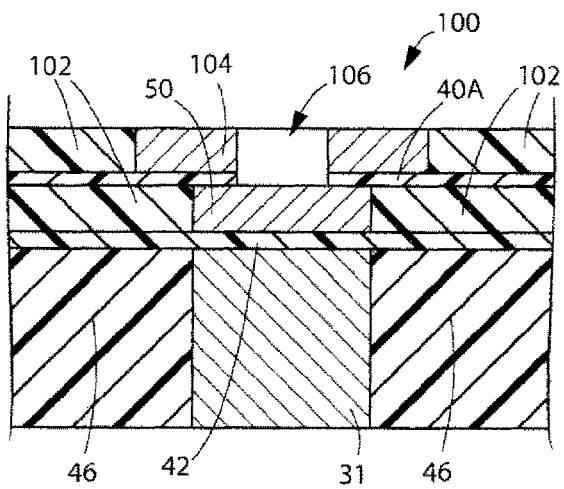

Referring to FIG. 8, an opening 106 may be formed through the conductive structure 104 at a selected location at which it is desired to form an intermediate portion 54 of the floating gate 34 (FIGS. 3A and 3B). The opening 106 may be formed by, for example, depositing a mask layer over the workpiece 100 and forming an aperture in the mask layer (not shown) at the location at which it is desired to form the opening 106 in the underlying conductive structure 104. An etching process (e.g., an anisotropic dry reactive ion or plasma etching process) then may be used to etch through the portion of the conductive structure 104 that is exposed through the mask layer.

Figure 9:
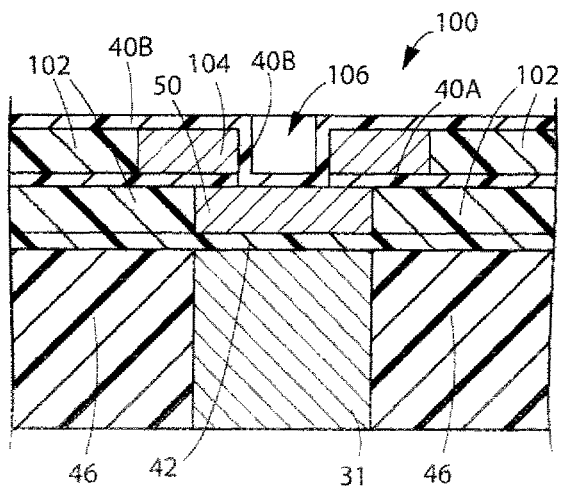
Figure 10:
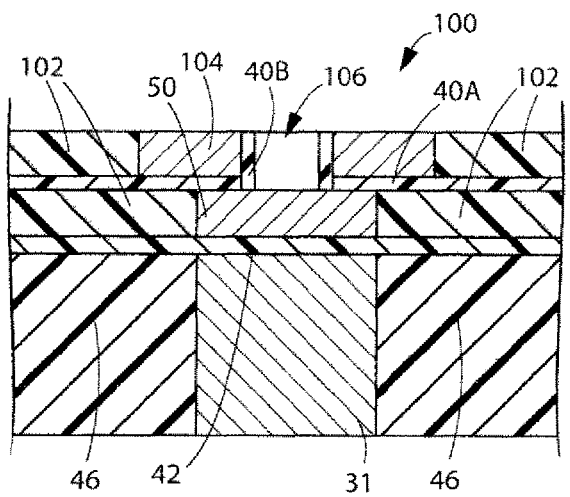

Referring to FIG. 9, another layer of inter-gate dielectric material 40B may be deposited, epitaxially grown, or otherwise provided at least over the regions of the workpiece 100 comprising the conductive structure 104 and within the opening 106. By way of example and not limitation, the inter-gate dielectric material 40B may comprise an oxynitride material and may be deposited using a chemical vapor deposition (CVD) process. As shown in FIG. 10, an anisotropic etching process (e.g., a dry reactive ion or plasma etching process) may be used to etch the layer of inter-gate dielectric material 40B from the horizontally extending surfaces of the workpiece 100, leaving behind a layer of the inter-gate dielectric material 40B on the vertically extending sidewalls of the conductive structure 104 within the opening 106.

Figure 11:
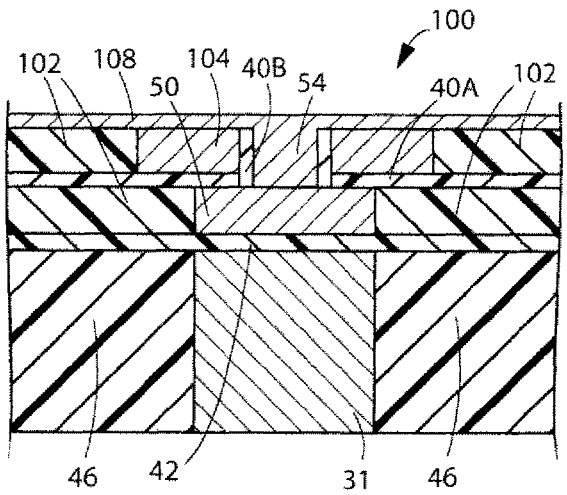
Figure 12:
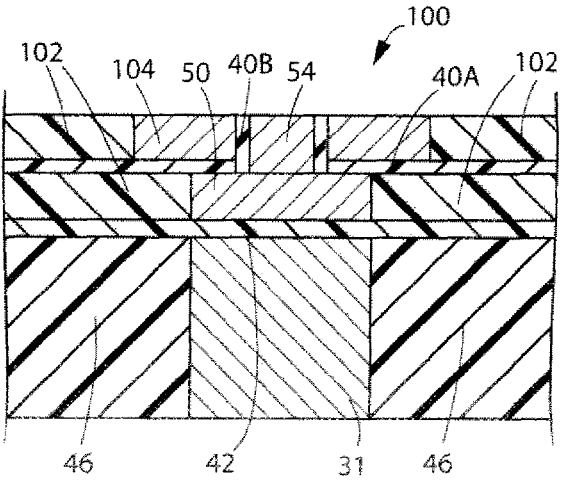

As shown in FIG. 11, a conductive material 108 may be provided within the opening 106 to form the intermediate portion 54 of the floating gate 34 (FIGS. 3A and 3B). By way of example and not limitation, a layer of conductive material 108 may be provided over the workpiece 100 to a thickness sufficient to substantially fill the opening 106, as shown in FIG. 11. The layer of conductive material 108 then may be planarized, as shown in FIG. 12, using, for example, a chemical-mechanical polishing (CMP) process, until the underlying dielectric material 102 is exposed. At this point the intermediate portion 54 of the floating gate 34 is separated from the remaining portion of the conductive structure 104 by the layer of the inter-gate dielectric material 40B on the vertically extending sidewalls of the conductive structure 104 previously formed within the opening 106.

In some embodiments, the end portions 50, 52 and the intermediate portion 54 of the floating gate 34 may comprise a polysilicon material (doped or undoped). In such embodiments, the intermediate portion 54 of the floating gate 34 may be formed using a selective epitaxial chemical vapor deposition (CVD) process in which polysilicon is selectively deposited only on exposed surfaces of previously formed polysilicon, such as the exposed surface of the first end portion 50 of the floating gate 34 within the opening 34.

In embodiments in which the intermediate portion 54 of the floating gate 34 is to comprise a single nanowire, the single nanowire may by grown or otherwise formed in situ on an exposed upper surface of the first end portion 50 of the floating gate 34 within the opening 106. Optionally, a catalytic material or structure configured to catalyze formation of the nanowire may be provided on the exposed upper surface of the first end portion 50 of the floating gate 34 within the opening 106 prior to growing or otherwise forming the nanowire therein.

Various methods of forming nanowires using corresponding catalyst materials are known in the art and may be used to form a single nanowire over the first end portion 50 of the floating gate 34. Some of such methods are described in, for example, Younan Xia et al. *One-Dimensional Nanostructures: Synthesis, Characterization and Applications*, 15 Advanced Materials 353-389 (March 2003), the relevant portions of which are incorporated herein by this reference. By way of example and not limitation, chemical vapor deposition (CVD) processes, which optionally may employ the so-called vapor-liquid-solid (VLS) mechanism, may be used to grow a nanowire using a catalytic structure, as known in the art. As one non-limiting example, such a catalytic structure may comprise a gold nanoparticle, and the nanowire may comprise a doped silicon (Si) material. Such a doped silicon nanowire may be formed using a chemical vapor deposition (CVD) process and the vapor-liquid-solid (VLS) mechanism, as known in the art. As another non-limiting example, such a catalytic structure may comprise at least one of Ti, Co, Ni, Au, Ta, polysilicon, silicon-germanium, platinum, iridium, titanium nitride, or tantalum nitride, and the nanowire may comprise iridium oxide ($IrO_x$), as described in United States Patent Publication No. 2006/0086314 A1 to Zhang et al., the entire disclosure of which is incorporated herein in its entirety by this reference. Furthermore, as previously discussed, the nanowire may comprise a III-V type semiconductor material or a II-V type semiconductor material. Various types of semiconductor materials that may be used to form nanowires, as well as the reactant precursor materials and catalyst materials that may be used to catalyze formation of such nanowires are disclosed in United States Patent Publication No. 2004/0028812 A1 to Wessels et al., the entire disclosure of which is also incorporated herein in its entirety by this reference.

In additional embodiments, such a nanowire may be fabricated elsewhere rather than in situ, and may be positioned within the opening 106 using, for example, a selectively oriented electrical field.

If the intermediate portion 54 of the floating gate 34 is to comprise a single nanowire, as discussed above, after forming the single nanowire on the first end portion 50 of the floating gate 34, the single nanowire may be surrounded with a dielectric material (e.g., to fill any remaining voids within the opening 106), such as an additional layer of inter-gate dielectric material (not shown), and the resulting structure then may be planarized as previously described in relation to FIG. 12 to expose an end of the nanowire through the dielectric material for subsequently forming the second end portion 52 of the floating gate 34 thereover and establishing electrical contact between the nanowire and the second end portion 52.

Figure 13:
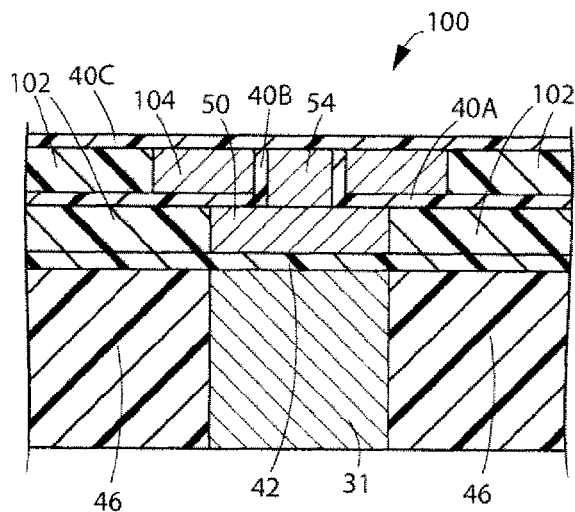
Figure 14:
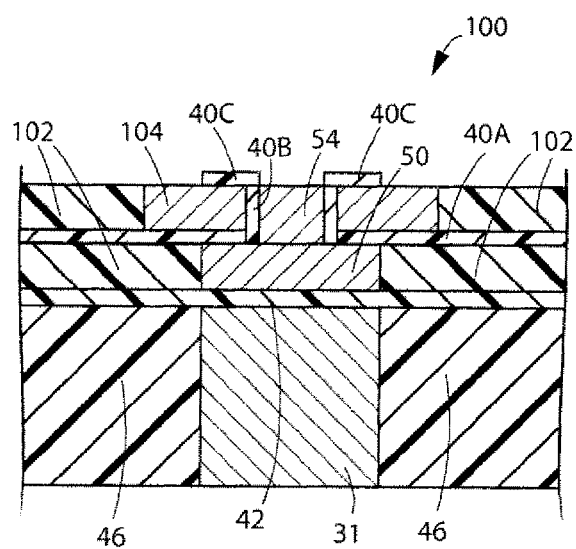

Referring to FIG. 13, another layer of inter-gate dielectric material 40C may be deposited, epitaxially grown, or otherwise provided at least over the regions of the workpiece 100 comprising the intermediate portion 54 of the floating gate 34 (FIGS. 3A and 3B) and the remaining portion of the conductive structure 104. By way of example and not limitation, the inter-gate dielectric material 40C may comprise an oxynitride material and may be deposited using a chemical vapor deposition (CVD) process. As shown in FIG. 14, the layer of inter-gate dielectric material 40C may be patterned to provide discrete regions of the inter-gate dielectric material 40C that will be disposed between the remaining portion of the conductive structure 104 and a second end portion 52 of the floating gate 34 (FIGS. 3A and 3B) that will be formed thereover.

Figure 15:
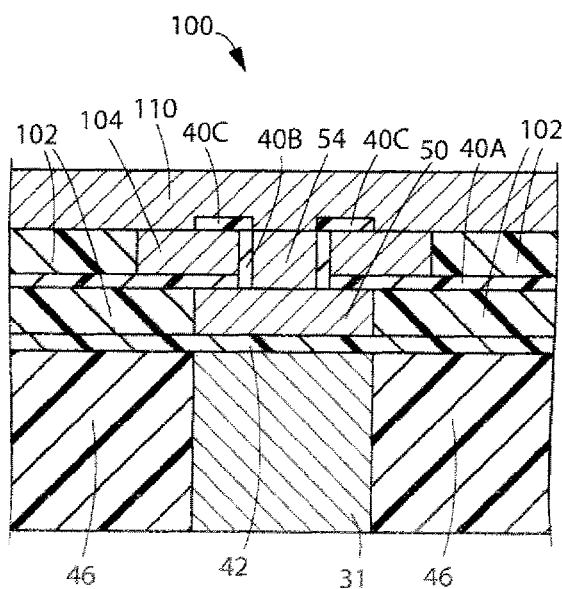
Figure 16:
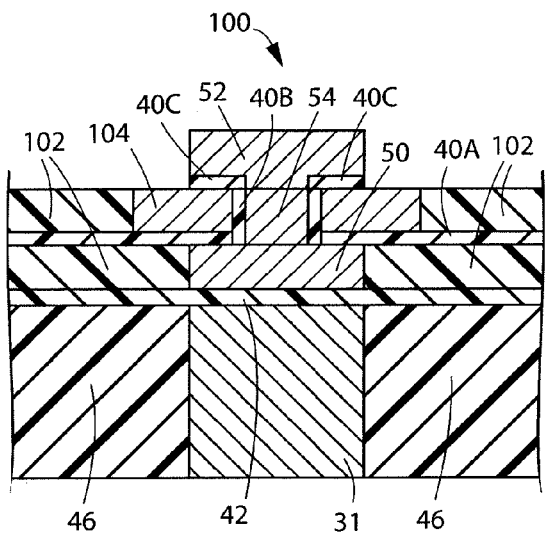

A second end portion 52 of the floating gate 34 (FIGS. 3A and 3B) may be formed over the intermediate portion 54 of the floating gate 34 and the discrete regions of inter-gate dielectric material 40C using conventional lithographic or sublithographic techniques. As a non-limiting example, another layer of conductive material 110 may be provided over at least the portions of the workpiece 100 comprising the discrete regions of inter-gate dielectric material 40C and the intermediate portion 54 of the floating gate 34, as shown in FIG. 15. Referring to FIG. 16, the layer of conductive material 110 (FIG. 15) then may be patterned to form a second end portion 52 of the floating gate 34 (FIGS. 3A and 3B). By way of example and not limitation, the layer of conductive material 110 (FIG. 15) may be patterned by providing a mask layer (not shown) over the layer of conductive material 110 and removing portions of the mask layer overlying regions of the layer of conductive material 110 that are to be removed (e.g., regions of the conductive material 110 that do not overlie the discrete regions of inter-gate dielectric material 40C and the intermediate portion 54 of the floating gate 34). An anisotropic etching process (e.g., a dry reactive ion or plasma etching process) then may be used to etch the regions of the layer of conductive material 110 (FIG. 15) that are exposed through the mask layer.

Figure 17:
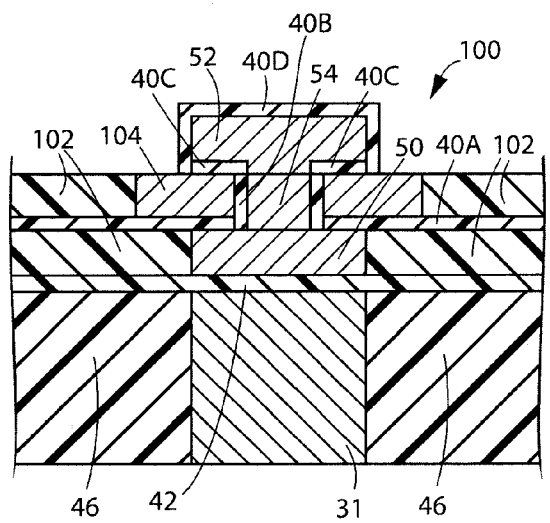

Referring to FIG. 17, an inter-gate dielectric material 40D may be provided over the exposed surfaces of the second end portion 52 of the floating gate 34 (FIGS. 3A and 3B). By way of example and not limitation, a layer of the inter-gate dielectric material 40D (e.g., an oxynitride material deposited using a chemical vapor deposition (CVD) process) may be provided over the workpiece 100, and a mask layer (not shown) may be provided over the exposed horizontally extending surface of the portion of the layer of the inter-gate dielectric material 40D that overlies the second end portion 52 of the floating gate 34. An anisotropic etching process (e.g., a dry reactive ion or plasma etching process) then may be used to etch regions of the layer of inter-gate dielectric material 40D that are exposed through the mask layer to form the structure shown in FIG. 17.

Figure 18:
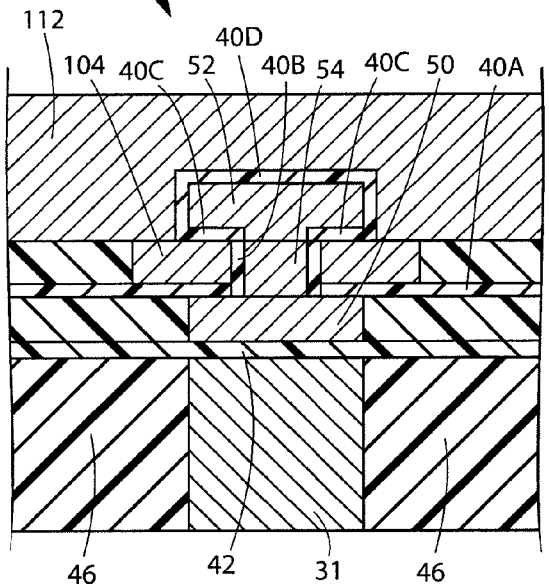
Figure 19:
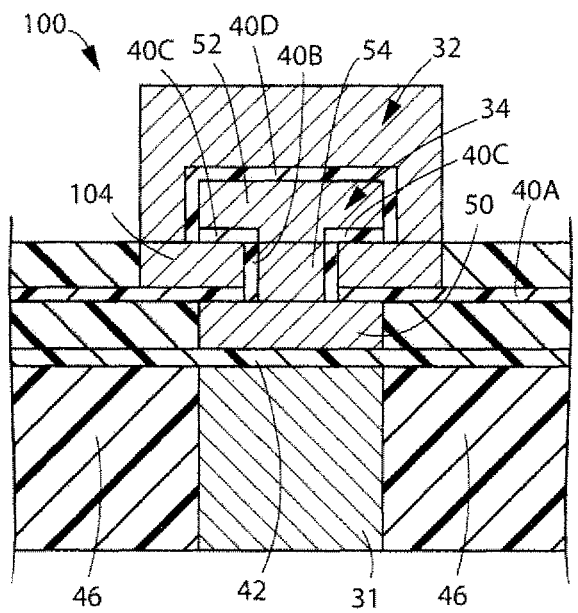

After forming the floating gate 34 (FIGS. 3A and 3B) and providing the inter-gate dielectric material 40D over the second end portion 52 thereof, as discussed above, the remaining portion of the control gate 32 (FIGS. 3A and 3B) may be formed over and around the second end portion 52 of the floating gate 34. By way of example and not limitation, another layer of conductive material 112 may be deposited over at least the portion of the workpiece 100 comprising the second end portion 52 of the floating gate 34 and the remaining portion of the conductive structure 104, as shown in FIG. 18. Referring to FIG. 19, the layer of conductive material 112 then may be patterned to complete formation of the control gate 32 (FIGS. 3A and 3B). By way of example and not limitation, the layer of conductive material 112 may be patterned by providing a mask layer (not shown) over the layer of conductive material 112 and removing portions of the mask layer overlying regions of the layer of conductive material 112 that are to be removed (e.g., regions of the conductive material 112 that do not overlie the second end portion 52 of the floating gate 34 and the remaining portion of the conductive structure 104). An anisotropic etching process (e.g., a dry reactive ion or plasma etching process) then may be used to etch the regions of the layer of conductive material 112 that are exposed through the mask layer.

Figure 20:
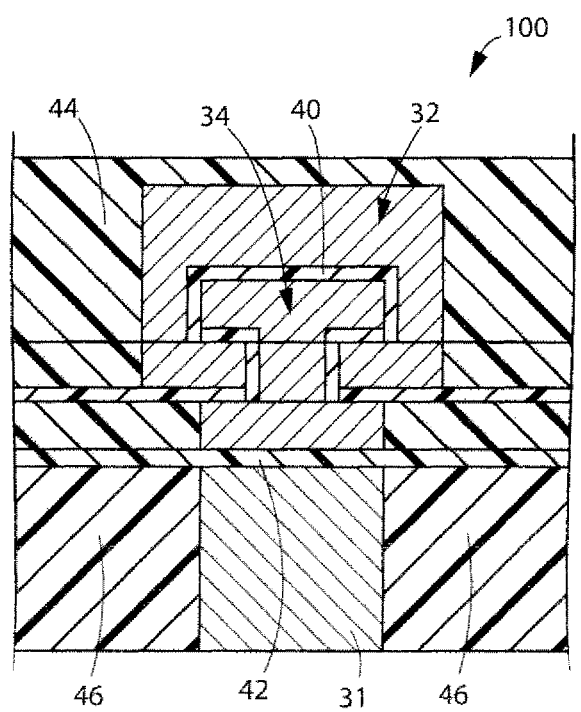

Referring to FIG. 20, additional dielectric material may be provided over and around the control gate 32 as necessary or desired so as to complete formation of the passivation layer 44. As can be seen by comparison of FIGS. 20 and 2B, in some embodiments, the passivation layer 44 may comprise various regions of dielectric material, each deposited or otherwise provided at different times during fabrication of the control gate 32 and the floating gate 34. Similarly, as can be seen with comparison of FIGS. 19 and 20, the inter-gate dielectric material 40 previously described with reference to FIGS. 2A, 2B, 3A, and 3B may comprise the various regions of inter-gate dielectric material 40A, 40B, 40C, and 40D that are also deposited or otherwise provided at different times during fabrication of the control gate 32 and the floating gate 34.

Figure 21:
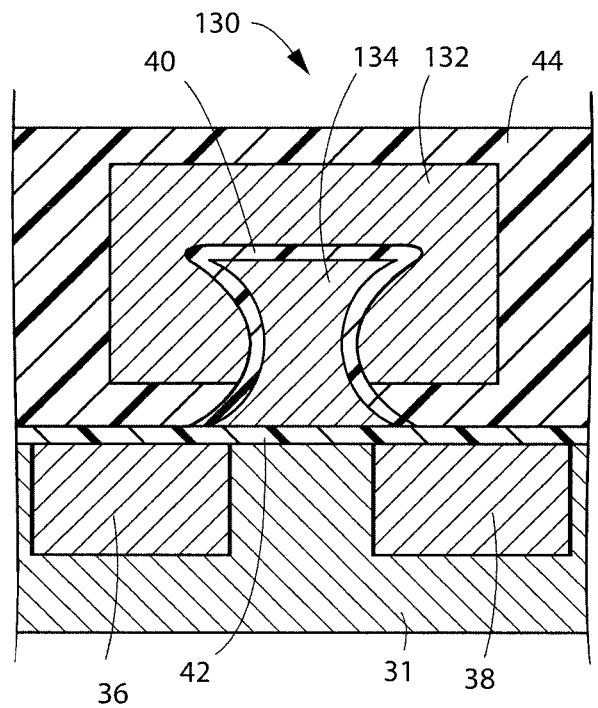
FIG. 21 is a partial cross-sectional view of another embodiment of a semiconductor device of the present invention.

FIG. 21 is a partial cross-sectional view of a portion of another embodiment of a semiconductor device 130 of the present invention, and illustrates a transistor having a dual gate structure. The transistor shown in FIG. 21, like that previously described with reference to FIGS. 2A, 2B, 3A, and 3B, may comprise a control gate 132, a floating gate 134, a source 36, and a drain 38. The transistor may comprise, for example, at least a portion of a memory cell in an array of memory cells of the semiconductor device 130. In some embodiments, the semiconductor device 130 may comprise a memory device having an array of memory cells, each of which may comprise a transistor as shown in FIG. 21.

The floating gate 134 is electrically isolated from the control gate 132 by an inter-gate dielectric material 40, and from the underlying substrate 31 (including the source 36 and the drain 38) by tunnel dielectric material 42. The control gate 132 and the floating gate 134 also may be electrically isolated from surrounding structures by a passivation layer 44.

As shown in FIG. 21, at least a portion of the floating gate 134 may have a shape generally similar to the floating gate 34 shown in FIGS. 3A and 3B and has two enlarged ends separated by a relatively smaller (e.g., narrower) intermediate section therebetween, as described in further detail below. At least a portion of the control gate 132 may have a shape that is complementary to that of the floating gate 134. For example, at least a portion of the control gate 132 may have a shape that is complementary to that of at least about one-half (e.g., the upper half shown in FIG. 21) of the floating gate 134. The shape of the floating gate 134 and the complementary shape of the control gate 132 are described in further detail below with reference to FIG. 22.

Figure 22:
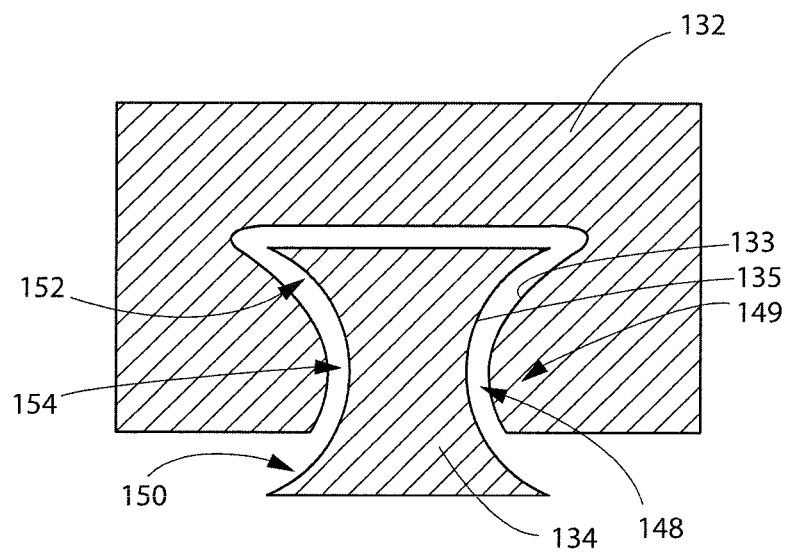
FIG. 22 is an enlarged view of a control gate and a floating gate of the semiconductor device shown in FIG. 21.

FIG. 22 is an enlarged view of the control gate 132 and the floating gate 134, as shown in FIG. 21. The other elements of the semiconductor device 130 are not illustrated in FIG. 22 to simplify the figure and facilitate description of the control gate 132 and the floating gate 134.

As shown in FIG. 22, the floating gate 134 may include a first end portion 150, a second end portion 152, and an intermediate portion 154 extending between the first end portion 150 and the second end portion 154. The first end portion 150 may be located proximate the source 36 and the drain 38 (FIG. 21), and the second end portion 152 may be located proximate the control gate 132. The intermediate portion 154 may have an average transverse cross-sectional area that is less than that of each of the first end portion 150 and the second end portion 152. In other words, the end portions 150, 152 may be enlarged relative to the intermediate portion 154. In some embodiments, the first end portion 150, second end portion 152, and intermediate portion 154 of the floating gate 134 each may have a substantially circular or a substantially rectangular cross-sectional shape. As a non-limiting example, the first end portion 150, the second end portion 152, and the intermediate portion 154 each may have a substantially rectangular (e.g., square) cross-sectional shape.

In contrast to the previously described floating gate 34, there may be no readily identifiable boundary between the first end portion 150, second end portion 152, and the intermediate portion 154 of the floating gate 134, as shown in FIGS. 21 and 22.

In some embodiments of the present invention, the floating gate 134 may comprise a doped polysilicon material, and the concentration of at least one dopant in the intermediate portion 154 of the floating gate 134 may differ from the concentration of the dopant in each of the first end portion 150 and the second end portion 152 of the floating gate 134. Such a configuration may facilitate fabrication of the floating gate 134, as discussed in further detail below.

As non-limiting examples, the first end portion 150, second end portion 152, and the intermediate portion 154 of the floating gate 134 may have average dimensions similar to those previously described in relation to the first end portion 50, second end portion 52, and the intermediate portion 54, respectively, of the floating gate 34 shown in FIGS. 3A and 3B.

As previously mentioned at least a portion of the control gate 132 may have a shape that is complementary to that of the floating gate 134. For example, the exterior surfaces of the floating gate 134 may define at least one recess 148 in the lateral sides of the floating gate 134, and the exterior surfaces of the control gate 132 may define at least one protrusion 149, which may be disposed at least partially within the at least one recess 148 of the floating gate 134, as discussed in further detail below.

As shown in FIG. 22, the control gate 132 may comprise at least one surface 133 opposing a lateral side surface 135 of the floating gate 134. The lateral side surface 135 of the floating gate 134 may at least partially define the recess 148 in the lateral sides of the floating gate 134.

In some embodiments, the control gate 132 may entirely surround the floating gate 134, and the at least one protrusion 149 of the control gate 132 may substantially fill the recess 148 of the floating gate 134. In other embodiments, however, the control gate 132 may not substantially entirely surround the floating gate 134, and the at least one protrusion 149 of the control gate 132 may not substantially fill the recess 148 of the floating gate 134.

One example of an embodiment of a method of the present invention that may be used to manufacture a semiconductor device comprising one or more transistors like that shown in FIGS. 21 and 22 is described below with reference to FIGS. 23-29.

Figure 23:
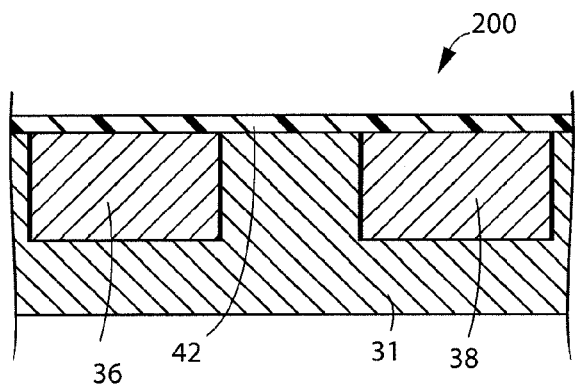
FIGS. 23 through 29 are partial cross-sectional side views of a workpiece and illustrate an embodiment of a method of the present invention that may be used to form a semiconductor device like that shown in FIG. 21.

Referring to FIG. 23, a workpiece 200 may be provided that includes a substrate 31 using methods known in the art.

The substrate 31 may comprise a full or partial semiconductor wafer, and may comprise a doped semiconductor material. Only a portion of the substrate 31 that is to comprise a single transistor is shown in the figures to facilitate illustration and description. It is contemplated, however, that the substrate 31 may be used to form one or more semiconductor devices (not shown), each of which may comprise a plurality of transistors like that shown in the figures. The workpiece 100 may comprise a source 36 and a drain 38 for each transistor being formed on the workpiece 100 (although in some devices, such as NAND Flash memory devices, at least some transistors may be connected in series, the drain 38 of one transistor being continuous with the source 36 of an adjacent transistor), as well as a plurality of isolation regions (not shown in the figures) similar to the isolation regions 46 shown in FIG. 4. As also shown in FIG. 23, a layer of tunnel dielectric material 42 may be deposited at least over the regions of the workpiece 200 on which a control gate 132 and floating gate 134 (FIGS. 21 and 22) are to be fabricated.

Figure 24:
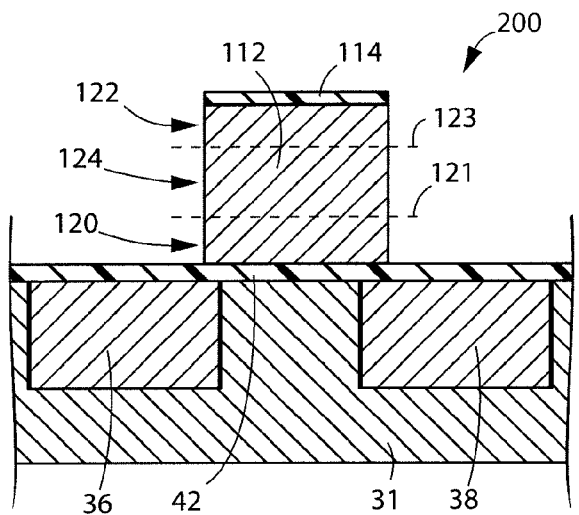

As shown in FIG. 24, a conductive structure 112 that may be used to form a floating gate 134 (FIGS. 21 and 22) may be formed vertically over the tunnel dielectric material 42 and generally horizontally between a source 36 and a drain 38 (FIG. 2A). The conductive structure 112 may be formed using conventional lithographic or sublithographic processes (e.g., photolithography (with or without a so-called "pitch doubling" process) or nanoimprint lithography). In some embodiments, for example, a layer of conductive material (not shown) may be deposited or otherwise provided over the substrate 31 and patterned using, for example, a masking and etching process to form the conductive structure 112. In other words, a layer of mask material (not shown) may be provided over the layer of conductive material, and the mask layer may be patterned to form a discrete region of mask material 114 overlying the layer of conductive material at a location at which it is desired to form the conductive structure 112. The layer of conductive material surrounding the discrete region of mask material 114 then may be selectively etched using, for example, an anisotropic etching process (e.g., an anisotropic dry reactive ion or plasma etching process).

The layer of conductive material (not shown) and the resulting conductive structure 112 may comprise a material composition that, when subsequently etched with a selected etchant, oxidized, or otherwise processed, will form a floating gate 134 having the general structure shown in FIG. 25. By way of example and not limitation, it is known in the art that the concentration of a dopant in a doped polysilicon material can affect the rate at which the doped polysilicon material is etched with particular etchants, and can also affect the rate at which the doped polysilicon material is oxidized when exposed to an oxidant.

Referring again to FIG. 24, in some embodiments, the conductive structure 112 may have a first lower region 120, a second upper region 122, and a third intermediate region 124 disposed between e first lower region 120 and the second upper region 122. The first lower region 120 is roughly illustrated in FIG. 24 as the portion of the conductive structure 112 below the dashed line 121, the second upper region 122 is roughly illustrated as the portion of the conductive structure 112 above the dashed line 123, and the third intermediate region 124 is roughly illustrated as the portion of the conductive structure 112 between the dashed line 121 and the dashed line 123. In actuality, there may be no readily identifiable boundary between the first lower region 120, the second upper region 122, and the third intermediate region 124 other than the concentration of the dopant therein.

The third intermediate region 124 may have an average dopant concentration that differs from both the average dopant concentration in the first lower region 120 and the average dopant concentration in the second upper region 122. For example, the conductive structure 112 may comprise polysilicon that is doped with an n-type dopant (e.g., phosphorous or arsenic). The concentration of the dopant in the third intermediate region 124 of the conductive structure 112 may be relatively higher that the concentrations of the dopant in each of the first lower region 120 and the second upper region 122. In some embodiments, the dopant concentration may continuously vary between the first lower region 120 and the second upper region 122, while in other embodiments, the dopant concentration may vary in a step-wise manner between the first lower region 120 and the third intermediate region 124 and between the third intermediate region 124 and the second upper region 122.

Figure 25:
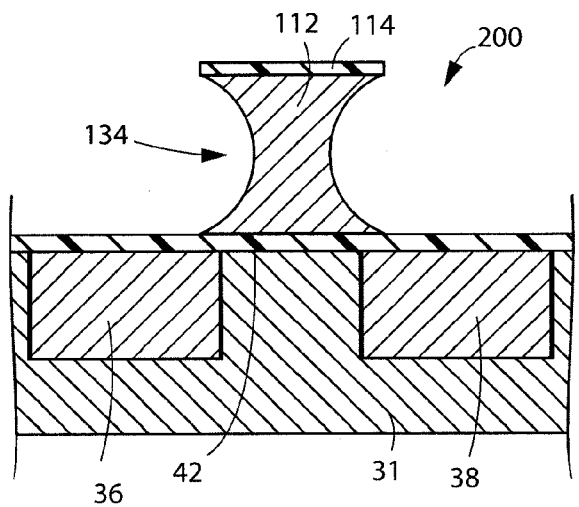

After forming a conductive structure 112 as shown in FIG. 24, the conductive structure 112 may be exposed to an etchant to form the structure shown in FIG. 25. By way of example and not limitation, the conductive structure 112 may be exposed to a wet chemical etching process or to a dry reactive ion or plasma etching process. In additional embodiments, the conductive structure 112 may be exposed to an oxidant to form an oxide layer (not shown) in the exposed surfaces of the conductive structure 112. After such an oxidation process, the un-oxidized portion of the conductive structure 112 may have a shape as shown in FIG. 25. After oxidation, the oxide layer optionally may be removed from the un-oxidized portion of the conductive structure 112 (using, for example, an etchant selective to the oxide layer) such that the resulting structure has a general shape as illustrated in FIG. 25.

The discrete region of mask material 114 optionally may be left over the conductive structure 112 as shown in FIG. 25 to protect the upper surface of the conductive structure 112 from the etchant or the oxidant. The discrete region of mask material 114 may be removed from the conductive structure 112 after the etching process, as shown in FIG. 26.

Figure 26:
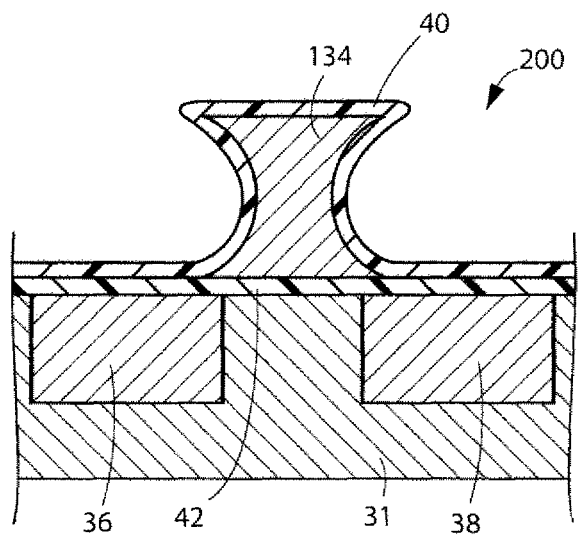

As also shown in FIG. 26, a layer of inter-gate dielectric material 40 may be deposited, epitaxially grow or otherwise provided on the workpiece 200 over at least the exposed surfaces of the floating gate 134. Optionally, any inter-gate dielectric material 40 provided over surfaces of the workpiece 200 other than the exposed surfaces of the floating gate 134 may be selectively removed from the workpiece 200 as necessary or desired.

Figure 27:
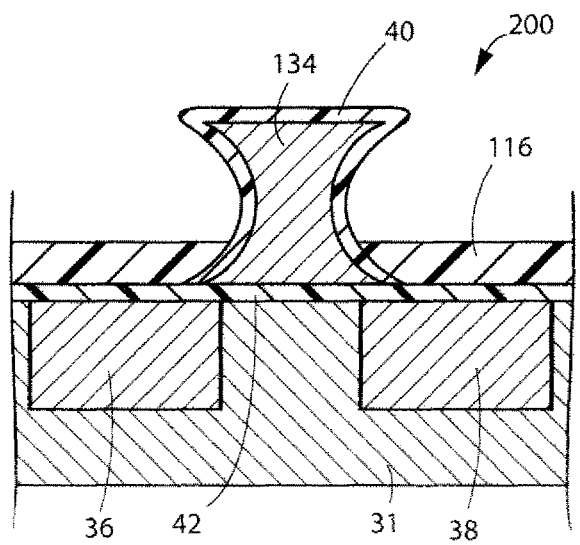

Referring to FIG. 27, a layer of dielectric material 116 may be provided over the workpiece 200 around the floating gate 134 to a thickness selected to provide a desired distance between the control gate 132 (FIGS. 21 and 22) to be formed thereover and the underlying source 36 and drain 38. By way of example and not limitation, a substantially conformal layer of dielectric material 116 may be deposited or otherwise provided over the workpiece 200. A masking and etching process then may be used to remove any dielectric material 116 undesirably deposited on surfaces of the inter-gate dielectric material 40 on the floating gate 134. In additional embodiments, a layer of lift-off material (not shown) may be selectively provided over at least a portion of the exposed surfaces of the inter-gate dielectric material 40 on the floating gate 134, after which the layer of dielectric material 116 may be deposited or otherwise provided over the lift-off layer. The lift-off layer then may be stripped away from the workpiece 200, and the overlying dielectric material 116 may be removed from the workpiece 200 together with the underlying lift-off layer.

Figure 28:
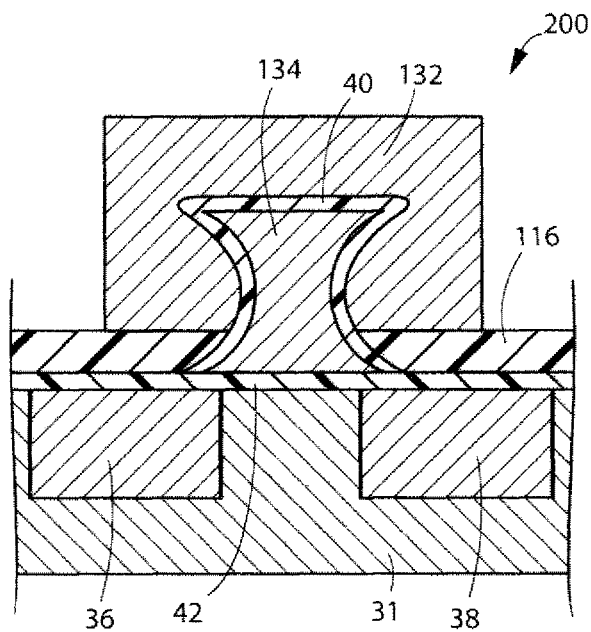

Referring to FIG. 28, a control gate 132 may be formed over and around the floating gate 134 (and the inter-gate dielectric material 40 thereon). By way of example and not limitation, another layer of conductive material (not shown) may be deposited over at least the portion of the workpiece 200 comprising the floating gate 134, and the layer of conductive material may be patterned to form the control gate 132. The layer of conductive material may be patterned by providing a mask layer (not show) over the layer of conductive material and removing portions of the mask layer overlying regions of the layer of conductive material that are to be removed. An anisotropic etching process (e.g., a dry reactive ion or plasma etching process) then may be used to etch the regions of the layer of conductive material that are exposed through the mask layer to form the control gate 132.

Figure 29:
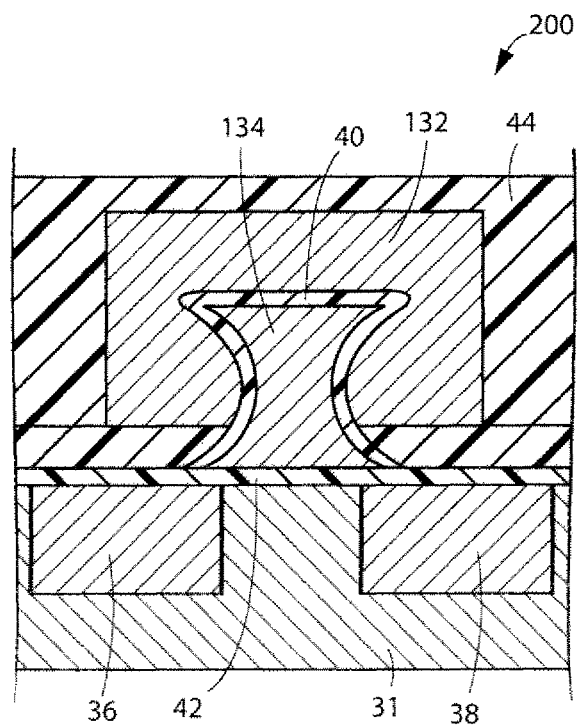

Referring to FIG. 29, additional dielectric material may be provided over and around the control gate 132 as necessary or desired so as to complete formation of the passivation layer 44.

At least one transistor having a floating gate and a control gate as described herein may be used in any type of semiconductor device including, for example, Flash memory devices (e.g., NOR Flash memory devices and NAND Flash memory devices) and electrically erasable programmable read-only memory (EEPROM) devices.

Embodiments of semiconductor devices of the present invention that comprise floating gate transistors as described above may exhibit relatively higher coupling ratios than semiconductor devices presently known in the art, and may be sealed to smaller feature sizes without decreasing the coupling ratio to an unacceptable level. In particular, by increasing the surface area of the opposing surfaces between the floating gate and the control gate of a transistor having a dual-gate structure, the capacitance $C_{FG-CG}$ between the floating gate and the control gate in each transistor between may be increased, which may increase the coupling ratio (CR) of the semiconductor device when the coupling ratio is defined as the ratio of the capacitance $C_{FG-CG}$ between the floating gate and the control gate in each transistor to the capacitance $C_{FG-FG}$ between the floating gates of adjacent transistors (i.e., $CR=C_{FG-CG}/C_{FG-FG}$).

Figure 30:
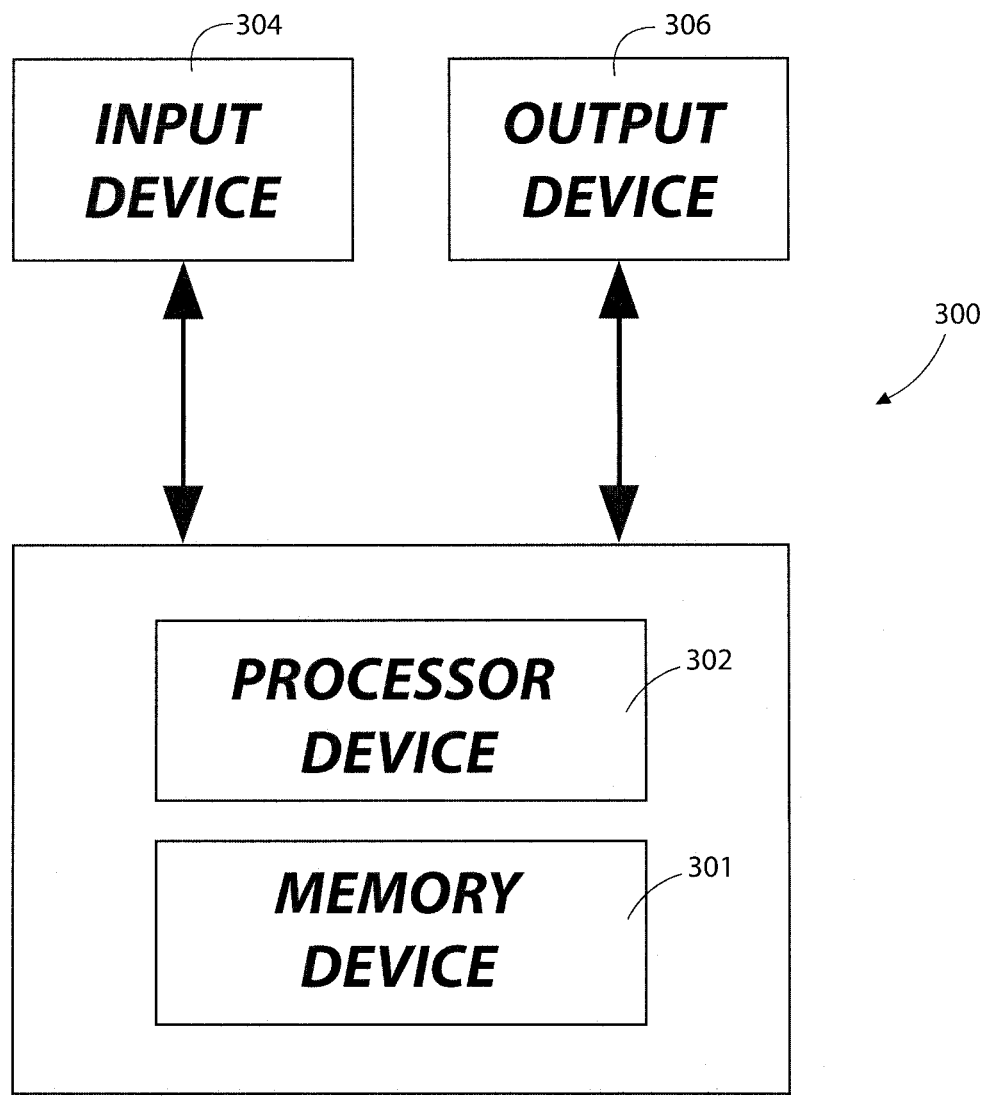
FIG. 30 is a schematic block diagram illustrating one embodiment of an electronic system of the present invention that includes a semiconductor device as described herein below.

Semiconductor devices like those previously described herein may be used in embodiments of electronic systems of the present invention. For example, FIG. 30 is a block diagram of an illustrative electronic system 300 according to the present invention. The electronic system 300 may comprise, for example, a computer or computer hardware component, a server or other networking hardware component, a cellular telephone, a digital camera, a personal digital assistant (PDA), portable media (e.g., music) player, etc. The electronic system 300 includes at least one memory device 301. The electronic system 300 further may include at least one electronic signal processor device 302 (often referred to as a "microprocessor"). At least one of the electronic signal processor device 302 and the at least one memory device 301 may comprise, for example, an embodiment of the semiconductor device 30 shown in FIGS. 2A and 2B or an embodiment of the semiconductor device 130 shown in FIG. 21. In other words, at least one of the electronic signal processor device 302 and the at least one memory device 301 may comprise an embodiment of a transistor having a dual-gate structure as previously described in relation to either the semiconductor device 30 shown in FIGS. 2A and 2B or the semiconductor device 130 shown in FIG. 21. The electronic system 300 may further include one or more input devices 304 for inputting information into the electronic system 300 by a user, such as, for example, a mouse or other pointing device, a keyboard, a touchpad, a button, or a control panel. The electronic system 300 may further include one or more output devices 306 for outputting information (e.g., visual or audio output) to a user such as, for example, a monitor, a display, a printer, an audio output jack, a speaker, etc. In some embodiments, the input device 304 and the output device 306 may comprise a single touchscreen device that can be used both to input information to the electronic system 300 and to output visual information to a user. The one or more input devices 304 and output devices 306 may communicate electrically with at least one of the memory device 301 and the electronic signal processor device 302.

While the present invention has been described in terms of certain illustrated embodiments and variations thereof it will be understood and appreciated by those of ordinary skill in the art that the invention is not so limited. Rather, additions, deletions and modifications to the illustrated embodiments may be effected without departing from the spirit and scope of the invention as defined by the claims that follow.

What is claimed is:

1. A semiconductor device having at least one transistor comprising:
   a source;
   a drain;
   a control gate; and
   a floating gate comprising:
      a first end portion proximate the source and the drain;
      a second end portion proximate the control gate; and
      an intermediate portion including a single nanowire extending between the first end portion and the second end portion, wherein the single nanowire has an average width less than about 50 nanometers, and wherein the intermediate portion has a smaller average cross-section than an average cross section of the first end portion.

2. The semiconductor device of claim 1, wherein the floating gate comprises a polysilicon material doped with a dopant.

3. The semiconductor device of claim 2, wherein the intermediate portion of the floating gate has an average concentration of the dopant differing from an average concentration of the dopant in the first end portion and an average concentration of the dopant in the second end portion.

4. The semiconductor device of claim 3, wherein a concentration of the dopant varies substantially continuously through the floating gate between the first end portion and the second end portion.

5. The semiconductor device of claim 1, wherein at least one surface of the control gate comprises a protrusion on the control gate, the protrusion at least partially disposed within a recess in a side of the floating gate.

6. The semiconductor device of claim 5, wherein the protrusion substantially fills the recess.

7. The semiconductor device of claim 1, wherein the single nanowire comprises a doped silicon material.

8. The semiconductor device of claim 1, wherein the single nanowire comprises a material selected from the group consisting of silicon, germanium, gallium, a III-V type semiconductor material, and a II-V type semiconductor material.

9. A semiconductor device having at least one transistor comprising:
   a source;
   a drain;
   a control gate; and
   a floating gate, comprising:
      a first end portion proximate the source and the drain;
      a second end portion proximate the control gate; and an intermediate portion including a single nanowire extending between the first end portion and the second end portion, wherein the single nanowire has an average width less than about 50 nanometers;

wherein at least a portion of the control gate has a shape substantially complementary to a shape of at least a portion of the second end portion of the floating gate.

10. The semiconductor device of claim 9, wherein the control gate comprises at least one surface opposing an upper surface of the second end portion of the floating gate and at least one surface opposing a lateral side surface of the second end portion of the floating gate.

11. The semiconductor device of claim 10, wherein the control gate further comprises at least one surface opposing at least a portion of a lateral side surface of the intermediate portion of the floating gate.

12. The semiconductor device of claim 11, wherein the at least one surface of the control gate opposing the at least a portion of the lateral side surface of the intermediate portion of the floating gate is disposed on a protrusion of the control gate, the protrusion at least partially disposed in a recess of the floating gate at least partially defined by the at least a portion of the lateral side surface of the intermediate portion of the floating gate.

13. A semiconductor device having at least one transistor comprising:
　a source;
　a drain;
　a control gate; and
　a floating gate, comprising:
　　a first end portion proximate the source and the drain;
　　a second end portion proximate the control gate; and
　　an intermediate portion including a single nanowire extending between the first end portion and the second end portion, wherein the single nanowire has an average width less than about 50 nanometers, and wherein the floating gate has a dumbbell shape.

14. A semiconductor device having at least one transistor comprising an electrically isolated floating gate and a control gate capacitively coupled with the floating gate, the control gate having at least one surface opposing an upper surface of an end portion of the floating gate and at least one surface opposing a lateral side surface of a single nanowire of the floating gate, the lateral side surface of the single nanowire of the floating gate defining a recess in the floating gate wherein the single nanowire has an average width less than about 50 nanometers.

15. The semiconductor device of claim 14, wherein the at least one surface of the control gate opposing the lateral side surface of the floating gate at least partially comprises a protrusion of the control gate at least partially disposed within the recess of the floating gate.

16. The semiconductor device of claim 15, wherein the protrusion of the control gate substantially fills the recess of the floating gate.

17. The semiconductor device of claim 14, wherein the floating gate comprises a polysilicon material doped with a dopant.

18. The semiconductor device of claim 17, wherein an intermediate portion of the floating gate has an average concentration of the dopant differing from an average concentration of the dopant in a first end portion of the floating gate and an average concentration of the dopant in a second end portion of the floating gate.

19. The semiconductor device of claim 14, wherein the single nanowire comprises a single crystal.

20. The semiconductor device of claim 14, wherein the single nanowire comprises a metal selected from the group consisting of cobalt, copper, gold, nickel, platinum, and silver.

21. A semiconductor device having at least one transistor comprising an electrically isolated floating gate and a control gate capacitively coupled with the floating gate, the floating gate comprising a single nanowire extending between a first end portion of the floating gate and a second end portion of the floating gate, the control gate disposed at least partially over and around the second end portion of the floating gate and at least partially around a portion of the single nanowire, wherein the single nanowire has an average width less than about 50 nanometers.

22. The semiconductor device of claim 21, wherein at least a portion of the control gate has a shape substantially complementary to a shape of the second end portion of the floating gate.

23. The semiconductor device of claim 22, wherein the control gate comprises at least one surface opposing an upper surface of the second end portion of the floating gate and at least one surface opposing a lateral side surface of the second end portion of the floating gate.

24. The semiconductor device of claim 23, wherein the control gate further comprises at least one surface opposing at least a portion of a lateral side surface of the single nanowire.

25. The semiconductor device of claim 24, wherein the at least one surface of the control gate opposing the lateral side surface of the single nanowire is disposed on a protrusion of the control gate.

26. An electronic system comprising:
　at least one electronic signal processor;
　at least one semiconductor device configured to communicate electrically with the at least one electronic signal processor; and
　at least one of an input device and an output device configured to communicate electrically with the at least one electronic signal processor, at least one of the at least one electronic signal processor and the at least one semiconductor device having at least one transistor comprising an electrically isolated floating gate and a control gate capacitively coupled with the floating gate, the control gate having at least one surface opposing an upper surface of an end portion of the floating gate and at least one surface opposing a lateral side surface of the floating gate, the lateral side surface of the floating gate defining a recess in the floating gate, wherein the floating gate of the at least one transistor further comprises:
　　an additional end portion proximate a source and a drain; and
　　an intermediate portion comprising a single nanowire disposed between the end portion and the additional end portion, wherein the single nanowire has an average width less than about 50 nanometers.

27. The electronic system of claim 26, wherein the electronic system comprises one of a computer, a computer hardware component, a server, a networking hardware component, a cellular telephone, a digital camera, a personal digital assistant, and a portable media player.

28. The electronic system of claim 27, wherein the input device comprises at least one of a pointing device, a keyboard, a touchpad, a touchscreen, and a button, and wherein the output device comprises at least one of a monitor, a display, a touchscreen, a printer, an audio output jack, and a speaker.

29. The electronic system of claim 26, wherein the at least one surface of the control gate opposing the lateral side surface of the floating gate at least partially comprises a protrusion of the control gate at least partially disposed within the recess of the floating gate.

30. The electronic system of claim 26, wherein the floating gate comprises a polysilicon material doped with a dopant.

31. The electronic system of claim 30, wherein an intermediate portion of the floating gate has an average concentration of the dopant differing from an average concentration of the dopant in a first end portion of the floating gate and an average concentration of the dopant in a second end portion of the floating gate.

32. The electronic system of claim 26, wherein the single nanowire comprises a nanotube.

33. The electronic system of claim 32, wherein the nanotube is selected from the group consisting of a single wall carbon nanotube and a multi-walled carbon nanotube.

34. An electronic system comprising:
at least one electronic signal processor;
at least one semiconductor device configured to communicate electrically with the at least one electronic signal processor; and
at least one of an input device and an output device configured to communicate electrically with the at least one electronic signal processor, at least one of the at least one electronic signal processor and the at least one semiconductor device having at least one transistor comprising an electrically isolated floating gate and a control gate capacitively coupled with the floating gate, the floating gate comprising a single nanowire having an average width less than about 50 nanometers extending between a first end portion of the floating gate and a second end portion of the floating gate, the control gate disposed at least partially over and around the second end portion of the floating gate and at least partially around a portion of the single nanowire.

35. The electronic system of claim 34, wherein the control gate comprises at least one surface opposing an upper surface of the second end portion of the floating gate and at least one surface opposing a lateral side surface of the second end portion of the floating gate.

36. The electronic system of claim 35, wherein the control gate further comprises at least one surface opposing at least a portion of a lateral side surface of the single nanowire.

37. The electronic system of claim 34, wherein the single nanowire is a substantially solid nanowire.

38. A method of forming a semiconductor device having at least one transistor, comprising:
forming a source and a drain;
forming a floating gate having a first end portion proximate to the source and the drain, a second end portion, and an intermediate portion including a single nanowire having an average width of less than about 50 nm extending between the first end portion and the second end portion, wherein the intermediate portion has an average cross-sectional area less than an average cross-sectional area of the first end portion; and
forming a control gate at least partially over and around at least the second end portion of the floating gate.

39. The method of claim 38, wherein forming a floating gate comprises:
forming the first end portion of the floating gate;
forming the second end portion of the floating gate over the first end portion of the floating gate;
forming an opening extending through the second end portion of the floating gate to the first end portion of the floating gate; and
filling the opening with a conductive material to form an intermediate portion of the floating gate extending between the first end portion and the second end portion.

40. The method of claim 39, further comprising:
forming a first portion of the control gate over the first end portion of the floating gate, wherein the second end portion of the floating gate is formed over the first portion of the control gate, and wherein forming the opening through the second end portion of the floating gate further comprises forming the opening through the first portion of the control gate; and
forming a second end portion of the control gate at least partially over and around at least the second end portion of the floating gate.

41. The method of claim 40, further comprising forming an inter-gate dielectric material on at least one surface of the first portion of the control gate within the opening prior to filling the opening with the conductive material.

42. The method of claim 38, wherein forming a floating gate comprises:
forming a conductive structure comprising polysilicon material doped with a dopant;
doping an intermediate portion of the conductive structure with an average concentration of the dopant differing from an average concentration of the dopant in a first end portion of the conductive structure and an average concentration of the dopant in a second end portion of the conductive structure; and
etching the conductive structure with an etchant at a rate at least partially dependent on the concentration of the dopant in the conductive structure.

43. The method of claim 38, further comprising forming the first end portion of the floating gate, and wherein forming the floating gate having an intermediate portion including the single nanowire comprises:
forming the single nanowire on a surface of the first end portion of the floating gate and establishing electrical contact between a first end of the single nanowire and the first end portion of the floating gate;
surrounding at least a portion of the single nanowire with a dielectric material; and
forming the second end portion of the floating gate over a second end of the single nanowire and establishing electrical contact between the second end of the single nanowire and the second end portion of the floating gate.

44. The method of claim 43, wherein forming the single nanowire on the surface of the first end portion of the floating gate includes growing the single nanowire using a catalytic structure.

* * * * *